(12) United States Patent
Hayashiyama et al.

(10) Patent No.: US 10,362,669 B2
(45) Date of Patent: Jul. 23, 2019

(54) CIRCUIT BOARD MODULE, ELECTRONIC DEVICE, AND METHOD FOR MANUFACTURING CIRCUIT BOARD MODULE

(71) Applicant: Toshiba Client Solutions Co., Ltd., Koto-ku, Tokyo (JP)

(72) Inventors: Shinya Hayashiyama, Tokyo (JP); Akihisa Shimizu, Tokyo (JP)

(73) Assignee: Toshiba Client Solutions CO., LTD., Tokyo (JP)

( * ) Notice: Subject to any disclaimer, the term of this patent is extended or adjusted under 35 U.S.C. 154(b) by 0 days.

(21) Appl. No.: 15/824,950

(22) Filed: Nov. 28, 2017

(65) Prior Publication Data
US 2018/0288870 A1 Oct. 4, 2018

(30) Foreign Application Priority Data

Mar. 29, 2017 (JP) ................. 2017-065827

(51) Int. Cl.
| H05K 1/14 | (2006.01) |
| H05K 1/02 | (2006.01) |
| H05K 3/40 | (2006.01) |
| H05K 1/18 | (2006.01) |
| H05K 3/34 | (2006.01) |

(52) U.S. Cl.
CPC ........... *H05K 1/0271* (2013.01); *H05K 1/181* (2013.01); *H05K 3/4007* (2013.01); *H05K 3/3436* (2013.01); *H05K 2201/10545* (2013.01); *H05K 2201/2009* (2013.01)

(58) Field of Classification Search
CPC ...... H05K 1/0271; H05K 1/181; H05K 1/183; H05K 3/3436; H05K 3/4007
USPC ......... 361/736; 174/255, 260, 252; 257/678, 257/738
See application file for complete search history.

(56) References Cited

U.S. PATENT DOCUMENTS

| 9,312,193 | B2* | 4/2016 | Chen ................. H01L 23/16 |
| 2009/0250258 | A1* | 10/2009 | Warigaya ............ H05K 3/3452 174/260 |
| 2011/0303441 | A1 | 12/2011 | Kobayashi et al. |
| 2013/0016289 | A1 | 1/2013 | Hayashimiyama et al. |

(Continued)

FOREIGN PATENT DOCUMENTS

| JP | 2011-258836 | 12/2011 |
| JP | 2013-26633 | 2/2013 |
| JP | 2014-63835 | 4/2014 |

*Primary Examiner* — Hung S. Bui
(74) *Attorney, Agent, or Firm* — Knobbe, Martens, Olson & Bear, LLP

(57) ABSTRACT

According to one embodiment, an electronic device includes housing, a circuit board in the housing, a semiconductor package, and a support plate on a second surface of the circuit board. The support plate is arranged at a position corresponding to a corner of the first area and includes a main portion, a first projecting portion in contact with the main portion at a first side of the main portion, and a second projecting portion in contact with the main portion at a second side of the main portion. The first projecting portion and the second projecting portion are arranged such that an imaginary line connecting a corner of the first projecting portion and a corner of the second projecting portion is outside the main portion.

10 Claims, 9 Drawing Sheets

(56) References Cited

U.S. PATENT DOCUMENTS

2013/0194516 A1* 8/2013 Hayashiyama ....... G06F 1/1637
348/836
2014/0078700 A1 3/2014 Masuyama et al.

* cited by examiner

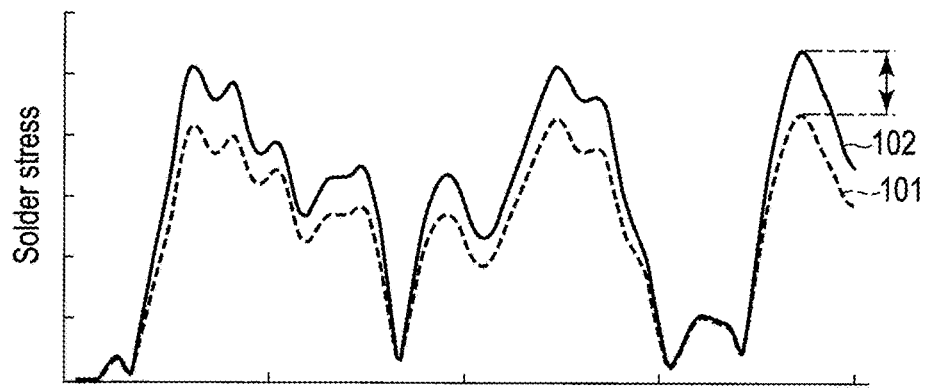
F I G. 6
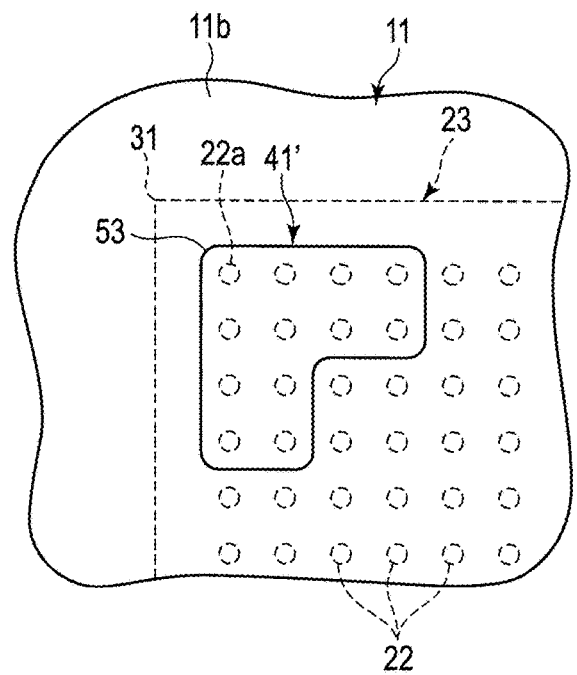
F I G. 7

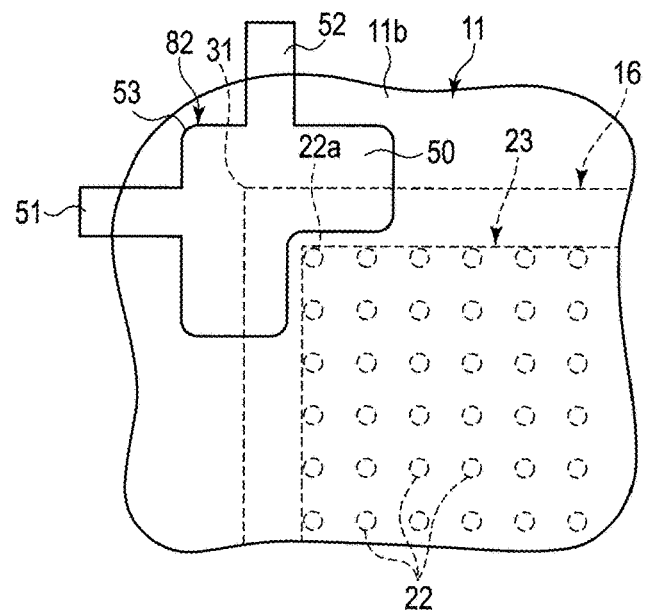
F I G. 9
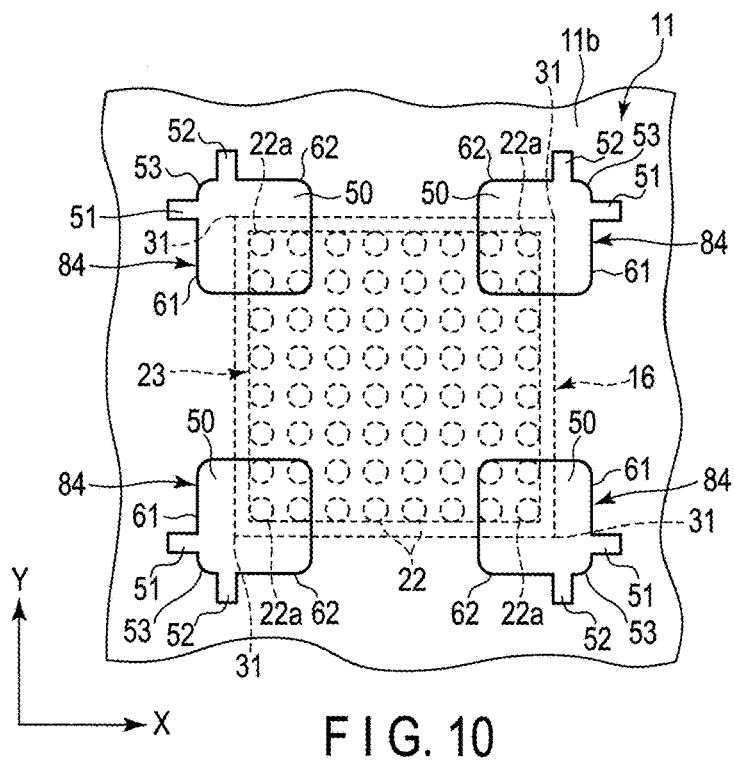
F I G. 10

CIRCUIT BOARD MODULE, ELECTRONIC DEVICE, AND METHOD FOR MANUFACTURING CIRCUIT BOARD MODULE

CROSS-REFERENCE TO RELATED APPLICATIONS

This application is based upon and claims the benefit of priority from Japanese Patent Application No. 2017-065827, filed Mar. 29, 2017, the entire contents of which are incorporated herein by reference.

FIELD

Embodiments described herein relate generally to a circuit board module, an electronic device, and a method for manufacturing the circuit board module.

BACKGROUND

In an electronic device such as a personal computer, semiconductor packages are mounted on a circuit board. A surface mountable package may be used for the semiconductor package. An example of the surface mountable package includes a BGA (ball grid array) package. When the electronic device with BGA packages is subjected to the impact of, for example, its fall, the circuit board may accidentally bent or deformed and mechanical stress may be applied to solder balls between the circuit board and the BGA packages.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 6 is a graph showing solder stress characteristics according to an embodiment and a comparative example.

FIG. 7 is a partially enlarged plan view of an L-shaped support plate according to a comparative example.

FIG. 9 is a plan view of a first modification of the support plate.

FIG. 10 is a plan view of a second modification of the support plate.

DETAILED DESCRIPTION

Figure 1:
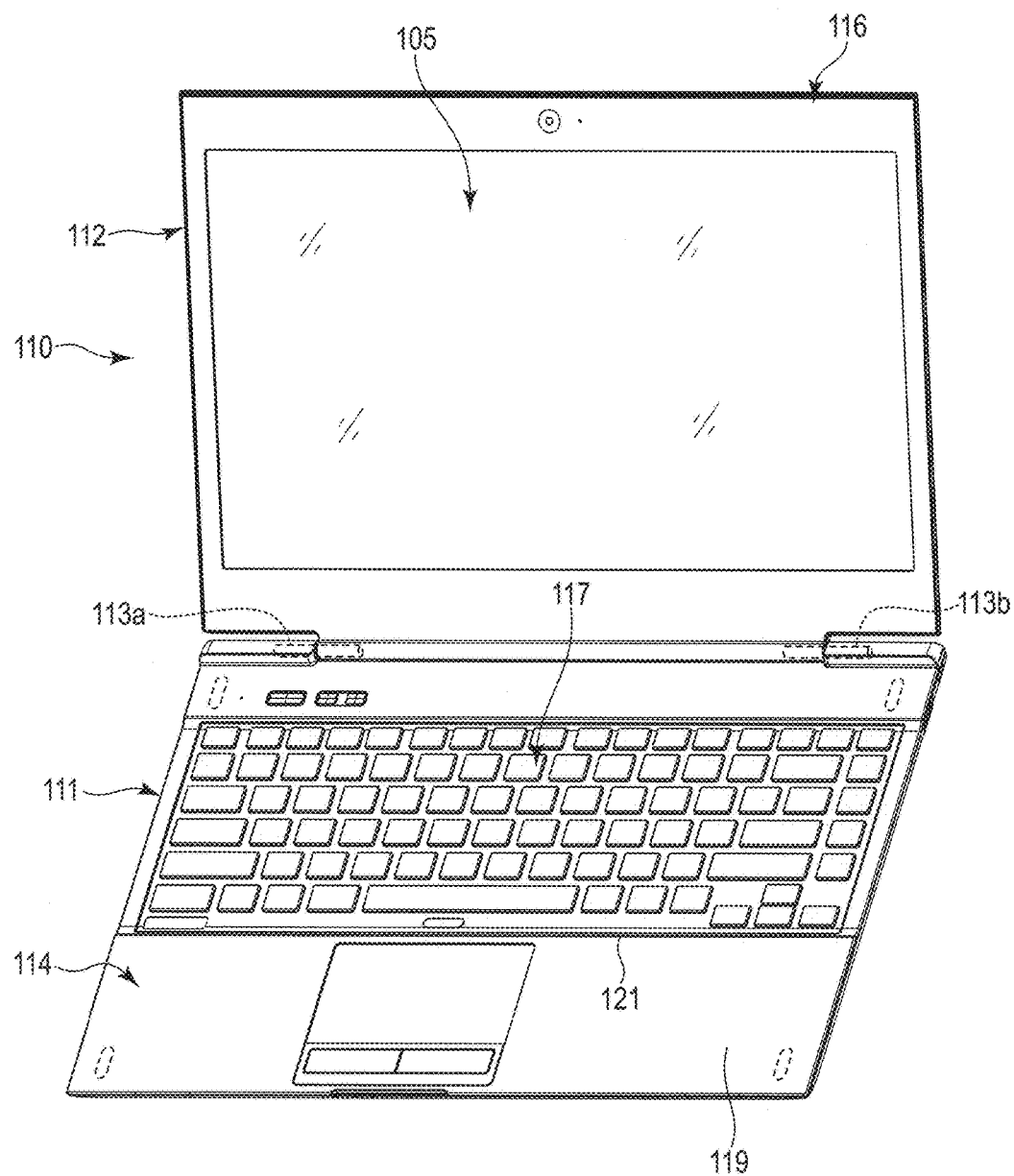
FIG. 1 is a perspective view of an electronic device according to an embodiment.

Various embodiments will be described hereinafter with reference to the accompanying drawings.

In general, according to one embodiment, an electronic device includes housing, a circuit board, a semiconductor package, and a support plate. The circuit board is in the housing and including a first surface and a second surface. The semiconductor package includes electrodes arrayed in a first area and mounted on the first surface of the circuit board. The support plate is on the second surface of the circuit board. The support plate is arranged at a position corresponding to a corner of the first area. The support plate includes a first side along a first side of the semiconductor package, a second side along a second side of the semiconductor package, a first projecting portion protruding from the first side of the support plate, and a second projecting portion protruding from the second side of the support plate. The line connecting a corner of the first projecting portion and a corner of the second projecting portion is outside the semiconductor package.

The disclosure is merely an example and is not limited by contents described in the embodiments described below. Modification which is easily conceivable by a person of ordinary skill in the art comes within the scope of the disclosure as a matter of course. In order to make the description clearer, the sizes, shapes and the like of the respective parts may be changed and illustrated schematically in the drawings as compared with those in an accurate representation. Constituent elements corresponding to each other in a plurality of drawings are denoted by the same reference numerals and their detailed descriptions may be omitted unless necessary.

A notebook type personal computer (notebook type PC) is explained as an example of an electronic device. The electronic device according to the embodiment is not limited to the notebook type PC. All of the embodiments and modifications described in this specification are widely applicable to, for example, many electronic devices such as slate type portable computers (slate PCs, tablet computers), desktop type personal computers, television receivers, mobile phones (including smart phones) and game consoles.

FIG. 1 is a perspective view of a notebook type PC 110 according to an embodiment. The notebook type PC 110 includes a first unit 111, a second unit 112 and hinges 113a and 113b connecting the first unit 111 and the second unit 112.

The first unit 111 includes a first housing 114. The first housing 114 includes a circuit board 11 shown in FIG. 2 as a main board, for example. A cover 119 covers an internal structure of the housing 114. A keyboard 117 is arranged on the outer surface of the cover 119.

The second unit 112 is a display unit, for example, and includes a second housing 116. The second housing 116 includes a display panel 105. Here, the display panel 105 is, for example, a liquid crystal display, but it is not limited to this.

The second unit 112 is rotatably joined to a rear end of the first unit 111 by the hinges 113a and 113b. When the second unit 112 is closed, the keyboard 117 and the display panel 105 face each other to be folded.

Figure 2:
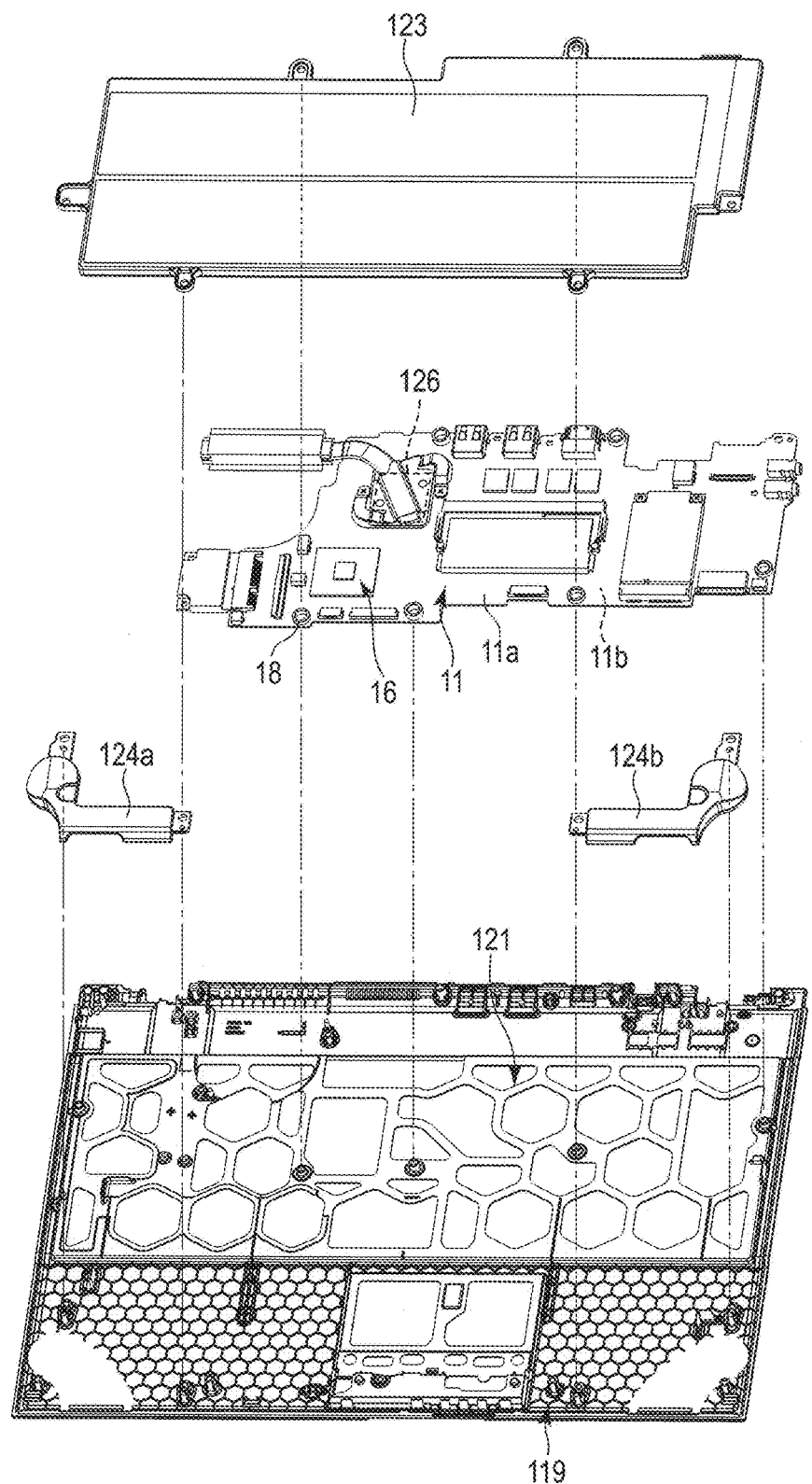
FIG. 2 is an exploded view showing an internal structure of the first unit 111 of the electronic device.

FIG. 2 is an exploded view of the inner structure of the housing 114 of the first unit 111 as seen from the bottom of the notebook type PC 110.

As shown in FIG. 2, a keyboard mount panel 121 is attached to an inner surface of the cover 119. A pair of loudspeakers 124a and 124b is attached to the inner surface of the cover 119 by screws. The circuit board 11 is attached to the keyboard mount panel 121 by screws. A battery 123 is attached to the keyboard mount panel 121 and the inner surface of the cover 119 by screws. The circuit board 11 is attached to the keyboard mount panel 121 by screws. A dot-dash line indicates a set of screw holes connected by the same screw. The circuit board 11 is electrically connected to the display panel 105 via, for example, wiring lines.

The circuit board 11 includes a first surface 11a and a second surface 11b. The second surface 11b is opposite to the first surface 11a. The first surface 11a is the lower surface which faces the bottom of the notebook type PC 110, and the second surface 11b is the upper surface which faces the cover 119.

As shown in FIG. 2, at least one circuit component, for example, two semiconductor packages 16 and 126 are mounted on the first surface 11a of the circuit board 11. The circuit board 11 and the semiconductor packages 16 and 126 are configured to form a circuit board module. The semiconductor packages 16 and 126 may be surface mountable packages, such as BGA (Ball Grid Array) packages, for example. As shown by the dot-dash line in FIG. 2, a screw hole 18 is arranged near a corner of the semiconductor package 16. When the notebook type PC 110 is subjected to the impact of, for example, its fall, the circuit board 11 may accidentally bent or deformed and mechanical stress in the form of an impact wave from the screw holes, for example, the screw hole 18 may be applied to bumps (solder joints) between the circuit board 11 and the semiconductor packages 16 and 126. Thus, the mechanical reliability of BGA packages is deteriorated due to the mechanical stress. According to the embodiment, reinforcement technology is adapted in order to protect the bumps of the BGA packages mounted on the circuit board 11.

Figure 3:
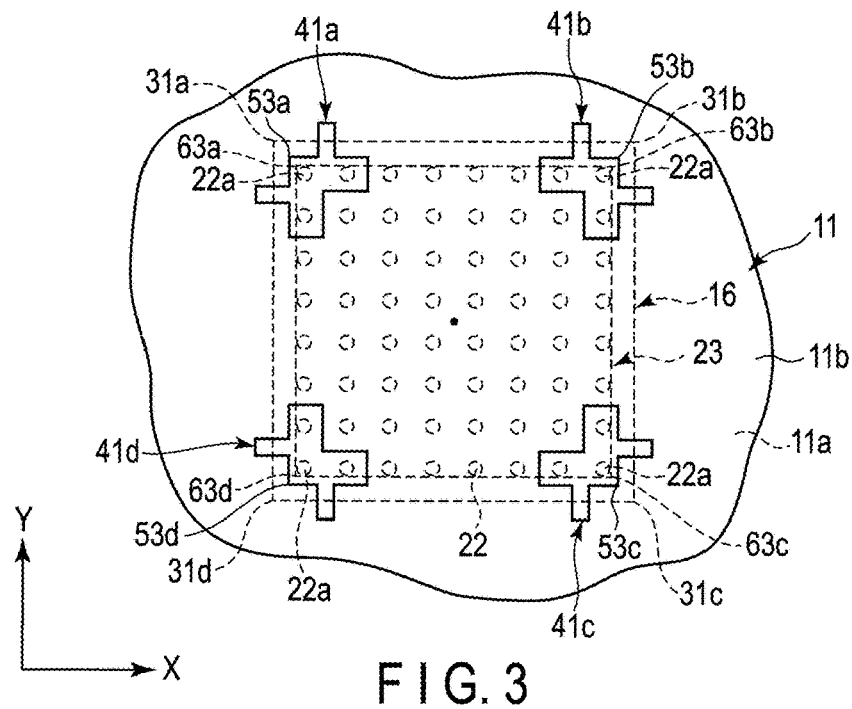
FIG. 3 is a plan view of a circuit board module with BGA type semiconductor package.

FIG. 3 is a plan view showing the circuit board module with reinforcement technology. The same reinforcement technology may be used for the semiconductor package 126 so that illustration of the semiconductor package 126 is omitted. FIG. 3 shows the second surface 11b of the circuit board 11. Components on the first surface 11a of the circuit board 11 are shown by a broken line to easily recognize the relative positions of the components on the first surface 11a and the components on the second surface 11b shown by a solid line.

As shown in FIG. 3, a plurality of bumps 22 on the semiconductor package 16 is arrayed in a matrix within a bump area 23. The semiconductor package 16 is mounted on the first surface 11a of the circuit board 11 via the bumps 22. The shape of the bump area 23 corresponds to the planar shape of the semiconductor package 16. If the semiconductor package 16 is shaped like a thin box and the planar shape of the semiconductor package 16 is square, the shape of the bump area 23 is square.

The bump area 23 includes four corners 63a, 63b, 63c, and 63d (generically named 63). The semiconductor package 16 is electrically connected to the wiring lines on the circuit board 11 via the bumps 22.

Four support plates 41a, 41b, 41c, and 41d (generically named 41) are arranged on the second surface 11b of the circuit board 11. The support plates 41a, 41b, 41c, and 41d are arranged at positions corresponding to four corners 31a, 32b, 32c, and 32d of the semiconductor package 16, i.e., the four corners 63a, 63b, 63c, and 63d of the bump area 23. Thus, the support plates 41a, 41b, 41c, and 41d cover corner bumps 22a arranged near the four corners 63a, 63b, 63c, and 63d. It is not necessary to provide all the four support plates 41a, 41b, 41c, and 41d. At least one of the four support plates 41a, 41b, 41c, and 41d may be omitted.

Figure 4A:
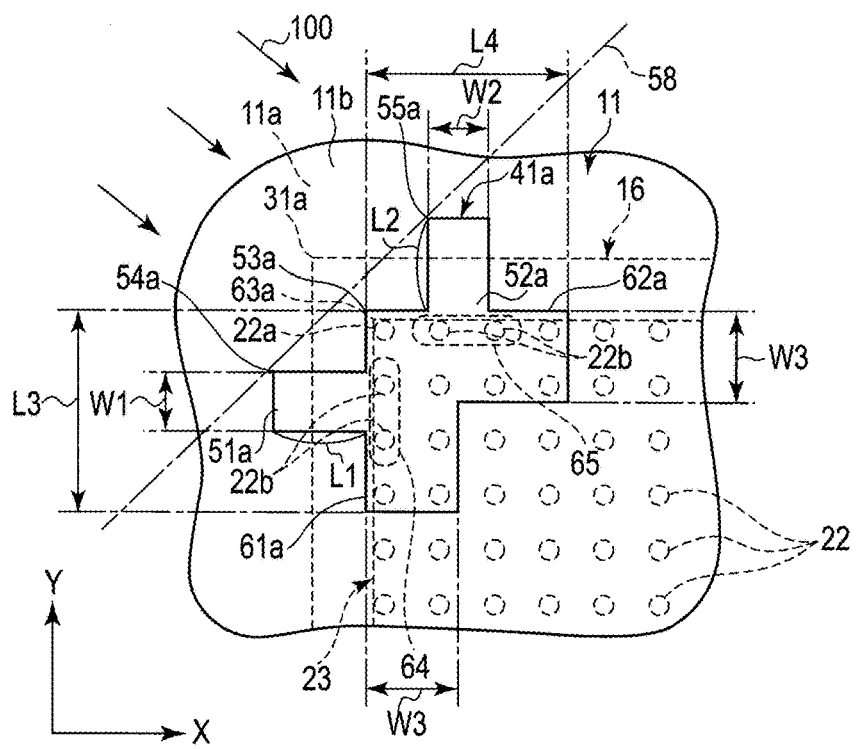
FIG. 4A is a partially enlarged plan view of the circuit board module at one of corners of the semiconductor package.
Figure 4B:
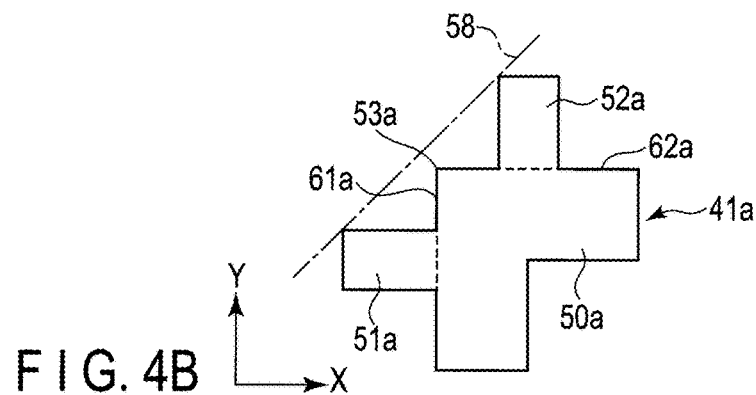
FIG. 4B is a plan view of a support plate at the corner of the semiconductor package.

FIG. 4A is an enlarged view of one of the four corners 31a, 32b, 32c, and 32d of the semiconductor package 16, for example, the corner 31a. FIG. 4B is an enlarged view of one of the support plates 41a, 41b, 41c, and 41d, for example, the support plates 41a. In the following description, other support plates 41b, 41c, and 41d have the same structure as support plates 41a. However, other support plates 41b, 41c, and 41d may have different structures.

FIG. 3 schematically shows the bumps 22 for convenience of explanation wherein the support plate 41 covers an end portion of a row (X direction) of the bumps 22 and an end portion of a column (Y direction) of the bumps 22. In FIG. 4A which is an enlarged view of FIG. 3, the support plate 41a covers an end portion of two rows of the bumps 22 and an end portion of two columns of the bumps 22.

The support plate 41a includes three portions: an L-shaped main portion 50a and two rectangular projecting portions 51a and 52a, as shown in FIG. 4B. The three portions are integrally formed to be the support plate 41a. Corner of the main portion 50a may be rounded. The first projecting portion 51a is in contact with the main portion 50a at a first outer side 61a. The first projecting portion 51a protrudes from the first outer side 61a in the same plane as the main portion 50a. The second projecting portion 52a is in contact with the main portion 50a at a second outer side 62a. The second projecting portion 52a protrudes from the second outer side 62a in the same plane as the main portion 50a. The support plate 41a is mounted on the circuit board 11 such that the first outer side 61a extends along the Y direction and is arranged between a first side of the semiconductor package 16 and a first side of the bump area 23. The support plate 41a is also mounted on the circuit board 11 such that the second outer side 62a extends along the X direction and is arranged between a second side of the semiconductor package 16 and a second side of the bump area 23. The support plate 41a is also mounted on the circuit board 11 such that the first projecting portion 51a extends along the X direction and the second projecting portion 52a extends along the Y direction.

Figure 5A:
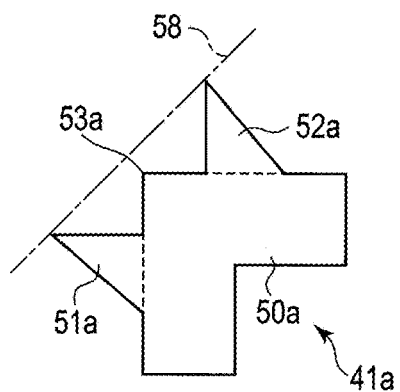
FIGS. 5A, 5B, 5C and 5D show a modification of the support plate.
Figure 5B:
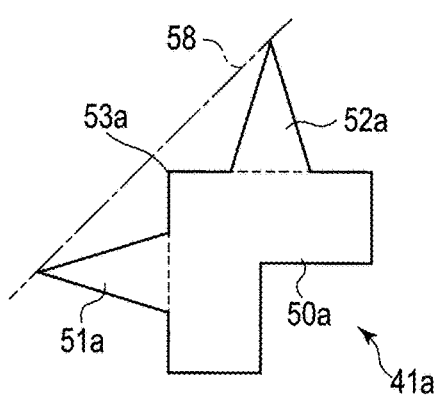
Figure 5C:
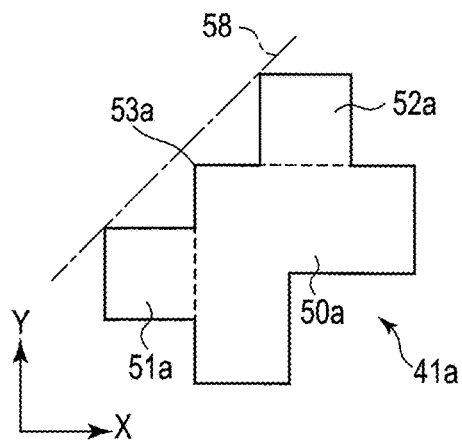
Figure 5D:
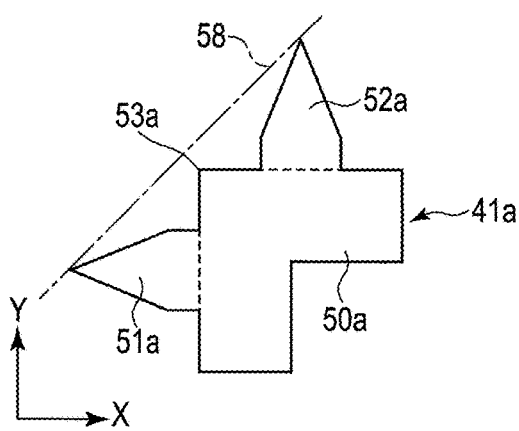

The first outer side 61a and the second outer side 62a are commonly connected to one of corners, for example, a corner 53a of the main portion 50a. The support plate 41a is also mounted on the circuit board 11 such that the corner 53 of the main portion 50a is arranged between the corner 63a of the bump area 23 and the corner 31a of the semiconductor package 16. The shape of the first projecting portion 51a and/or the second projecting portion 52a may be triangular (FIGS. 5A and 5B), square (FIG. 5C), or a combination of a triangular and rectangular (FIG. 5D). At least one corner of the projecting portions 51a and 52a may be rounded.

According to the support plate 41 mounted on the circuit board 11, as shown in FIG. 4A, the first projecting portion 51a and the second projecting portion 52a are configured to receive an impact wave before the corner 53a of the main portion 50a receives the impact wave if the impact wave 100 is transmitted from the oblique direction, as shown in FIG. 4, thereby preventing the impact wave from being concentrated onto the corner bump 22a. According to the embodiment, an imaginary line 58 connecting an apex of the first projecting portion 51a and an apex of the second projecting portion 52a is outside the main portion 50a in the plan view shown in FIG. 4A. Stated another way, the imaginary line 58 does not cross the main portion 50a in the plan view. If the shape of the projecting portions 51a and 52a is rectangular, one of the two corners of the projecting portion 51a which is near to the corner 53a corresponds to the apex 54a and one of the two corners of the projecting portion 52a which is near to the corner 53a corresponds to the apex 55a. Though distal ends of the projecting portions 51a and 52a of FIGS. 3 and 4A are outside the planar area of the semiconductor package 16 in the plan view, they may be inside the planar area of the semiconductor package 16 on the condition that the imaginary line 58 is outside the main portion 50a or does not cross the main portion 50a.

The corner 53a of the main portion 50a is arranged near the corner 63a of the bump area 23. For example, the corner 53a of the main portion 50a is outside the bump area 23 and inside the planar area of the semiconductor package 16. Thus, the support plate 41 is used as a back plate so as to cover the corner portions of the bump area 23 to which the impact waves may be concentrated. FIGS. 3 and 4A show the support plate 41a wherein the corner 53a, the first outer side 61a, and the second outer side 62a are inside the planar area of the semiconductor package 16. But they may be outside the planar area of the semiconductor package 16. The shape of the main portion 50a is not limited to the L-shape. The shape of the main portion 50a may be triangular, rectangular, or square coveting the corners of the bump area 23

The four support plates 41 are each individually mounted on the circuit board 11. A length L3 of the first outer side 61 along the Y direction and a length L4 of the second outer side 62 along the X direction may be, for example, about 5 mm. A width W3 of the main portion 50 may be, for example, about 3 mm. A thickness of the support plate 41 may be, for example, about 0.5 mm. A width W1 of the first projecting portion 51a along the Y direction and a width W2 of the second projecting portion 52a along the X direction are, for example, about 1.2 mm. A length L1 of the first projecting portion 51a along the X direction and a length L2 of the second projecting portion 52a along the Y direction are, for example, about 2.0 mm. The dimensions of the support plate 41 are not limited to those mentioned above.

With use of the support plate 41 with the above-described structure, if an impact wave transmits along a direction indicated by an arrow 100, for example, the corner 54a of the first projecting portion 51a and the corner 55a of the second projecting portion 52a receive the impact wave before the corner 53a of the main portion 50a receives the impact wave. Therefore, the stress is dispersed to bumps 22b in a region 64 near the first projecting portion 51a and bumps 22c in a region 65 near the second projecting portion 55a, and the stress is not concentrated to the corner bump 22a. Thus, the effect of reinforcing the circuit board 11 by the support plate 41 can be improved.

An example of a material of the support plates 41 may be that having a coefficient of linear expansion close to that of the circuit board 11, which is, for example, stainless steel (SUS). Therefore, the circuit board 11 does not easily receive a heavy stress in the temperature cycle in user environments.

A material of the support plate 41 is not limited to those of the above example. The support plate 41 may be, for example, of a resin material or of the same material as that of the circuit board. Moreover, an adhesive or solder which is applied to be hardened on the circuit board 11 can be used as the support plate 41.

Moreover, the semiconductor package 16 is not limited to the BGA type package, but may be selected from various packages including area array type or other types of semiconductor components.

In order to verify In order to verify how much the reinforcement effect is improved by dispersing the stress applied to a corner bump, the drop impact test was carried out using a circuit board module (dimensions of 130 mm×80 mm) having support plates 41 with the first and second projecting portions according to the embodiment and a circuit board module having support plates 41' (see FIG. 7) according to a comparative example. The support plate 41' is formed of an L-shaped main portion and does not include first and second projecting portions.

First, under the conditions in conformity with JESD22-B111 of JDEDC standards, impact waves were applied to the circuit board using a drop tester, and the number of times of drop until electric conduction failure occurs was measured.

FIG. 6 is a graph showing time history response simulation of the solder stress for a circuit board module having the support plates with the first and second projecting portions and a circuit board module having the support plates without the first and second projecting portions.

FIG. 7 is a schematic diagram showing the structure of the circuit board module having a support plate 41' without the first and second projecting portions as a comparative example.

Curve 101 in a broken line indicates a simulation result for the circuit board module according to the embodiment. Curve 102 in a sold line indicates a simulation result for the circuit board module according to the comparative example.

From the curves 101 and 102, it is understood that when impact waves are applied as in the above-described drop impact test, the solder stress on bumps reduces by 20% in the circuit board module according to the embodiment as compared to the circuit board module according to the comparative example.

The area of the support plate 41 with the first and second projecting portions is 15% less than that of the support plate 41' without the projecting portions.

From this fact, it is understood that with the support plate 41 with the first and second projecting portions, even if the area is reduced by 15%, the reinforcement effect can be improved by 20% as compared to the support plate 41' without the projecting portion. Further, by using this support plate 41, it becomes possible to reduce the thickness of the housing of the notebook type PC by 0.2 mm while maintaining the reinforcement effect.

The size of the support plate 41 is not limited to the above size.

An example of the support plate 41 may be a metal plate (metal piece), for example. On the second surface 11b of the circuit board 11, the support plate 41 may be attached to the circuit board 11 by soldering, for example.

Figure 8:
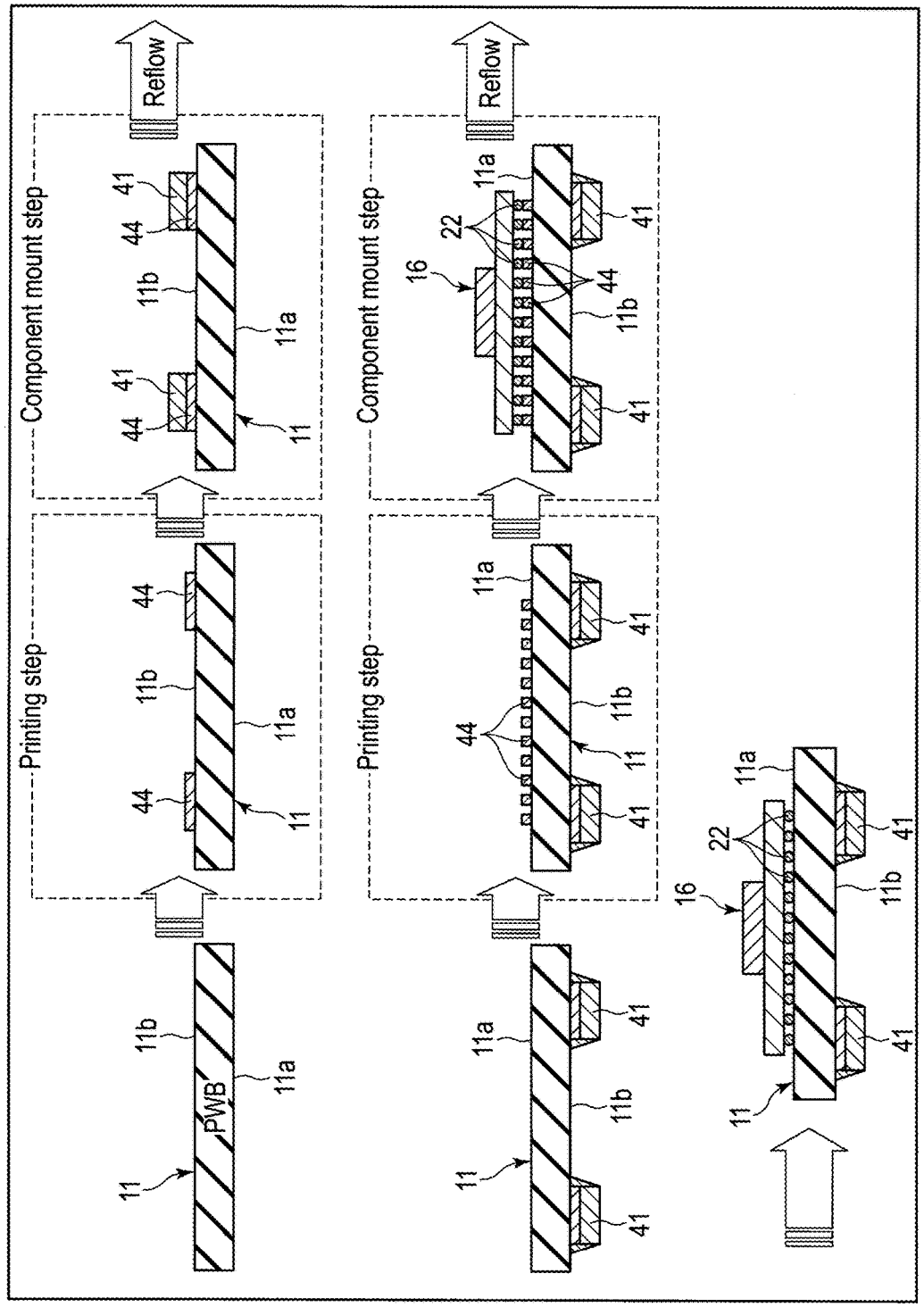
FIG. 8 shows an example of a process of manufacturing the circuit board module.

FIG. 8 shows an example of a process of manufacturing the circuit board module.

First, the circuit board 11 is prepared.

Then, solders 44 (solder pastes) are printed on the second surface 11b of the circuit board 11 in the first printing step.

Next, the support plates 41 are arranged on the solders 44 in the first component mount step, and then it is attached to the second surface 11b through a first reflow step. That is, the support plates 41 are mounted in the surface mount step together with other components to be mounted in the second surface 11b.

Next, the solders 44 are printed on the first surface 11a of the circuit board 11 in the second printing step. Then, the semiconductor package 16 is mounted on the solders 44 in the second component mount step, and then the semiconductor package 16 is mounted on the first surface 11a through a second reflow step. Thus, the circuit board module is completed.

Now, modifications of the support plate 82 will be described.

FIG. 9 shows a first modification of the support plate 82.

As shown, in the first modification, the entire support plate 82 is outside the bump area 23. That is, the support plate 82 does not cover bumps 22. The corners of the main portion of the support plate 82 are rounded. Even with such a structure, the support plate 82 can receive, by the first projecting portion 51 and the second projecting portion 52 both outside the planar area of the semiconductor package 16, an impact wave transmitted on the circuit board 11 towards the corner bump 22a. Further, the corner bump 22a can be prevented from being destroyed.

Thus, the stress on the corner bump 22a can be reduced and the mechanical reliability is enhanced.

The mechanical reliability is enhanced if the support plate is arranged at the periphery of the bump area 23 to cover some of the bumps 22, as shown in FIGS. 3 and 4.

A second modification shown in FIG. 10 is similar to the embodiment shown in FIGS. 3 and 4 except that the shape of a main portion 50 of a support plate 84 according to the second modification is square. Corners of the square main portion 50 may be rounded. The first outer side 61 of the main portion 50 extends along the Y direction. The second outer side 62 of the main portion 50 extends along the X direction. The first outer side 61 and the second outer side 62 are outside the planar area of the semiconductor package 16. The first outer side 61 and the second outer side 62 are commonly connected to one of corners, the corner 53 of the main portion 50. The corner 53 is arranged near the corner 31 of the semiconductor package 16. The first projecting portion 51 is in contact with the main portion 50 at the first outer side 61 and protrudes from the first outer side 61 in the same plane as the main portion 50. The second projecting portion 52 is in contact with the main portion 50 at the second outer side 62 and protrudes from the second outer side 62 in the same plane as the main portion 50. The shape of the first projecting portion 51 and/or the second projecting portion 52 may be triangular, rectangular, square, or a combination of a triangular and rectangular. Corners of the projecting portions 51 and 52 may be rounded. The first projecting portion 51 and the second projecting portion 52 are configured to receive an impact wave before the corner 53 receives the impact wave if the impact wave is transmitted from the oblique direction, thereby preventing the impact wave from being concentrated onto the corner bump 22a.

Figure 11:
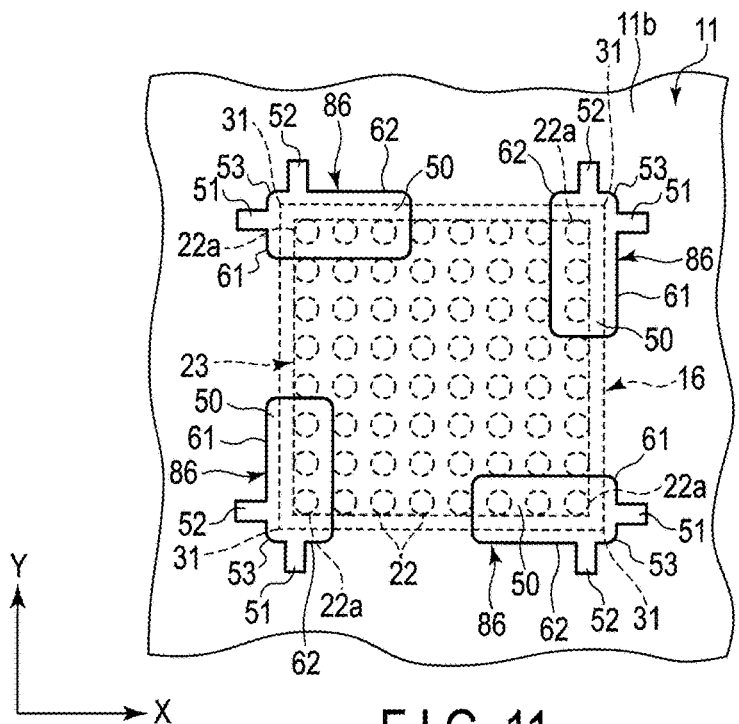
FIG. 11 is a plan view of a third modification of the support plate.

A third modification shown in FIG. 11 is similar to the embodiment shown in FIGS. 3 and 4 except that the shape of a main portion 50 of a support plate 86 according to the third modification is rectangular. Corners of the rectangular main portion 50 may be rounded. The first outer side 61 of the main portion 50 extends along the Y direction. The second outer side 62 of the main portion 50 extends along the X direction. The first outer side 61 and the second outer side 62 are outside the planar area of the semiconductor package 16. The first outer side 61 and the second outer side 62 are commonly connected to one of corners, the corner 53 of the main portion 50. The corner 53 is arranged near the corner 31 of the semiconductor package 16. The first projecting portion 51 is in contact with the main portion 50 at the first outer side 61 and protrudes from the first outer side 61 in the same plane as the main portion. The second projecting portion 52 is in contact with the main portion 50 at the second outer side 62 and protrudes from the second outer side 62 in the same plane as the main portion 50. The shape of the first projecting portion 51 and/or the second projecting portion 52 may be triangular, rectangular, square, or a combination of a triangular and rectangular. Corners of the projecting portions 51 and 52 may be rounded. The first projecting portion 51 and the second projecting portion 52 are configured to receive an impact wave before the corner 53 receives the impact wave if the impact wave is transmitted from the oblique direction, thereby preventing the impact wave from being concentrated onto the corner bump 22a.

Figure 12:
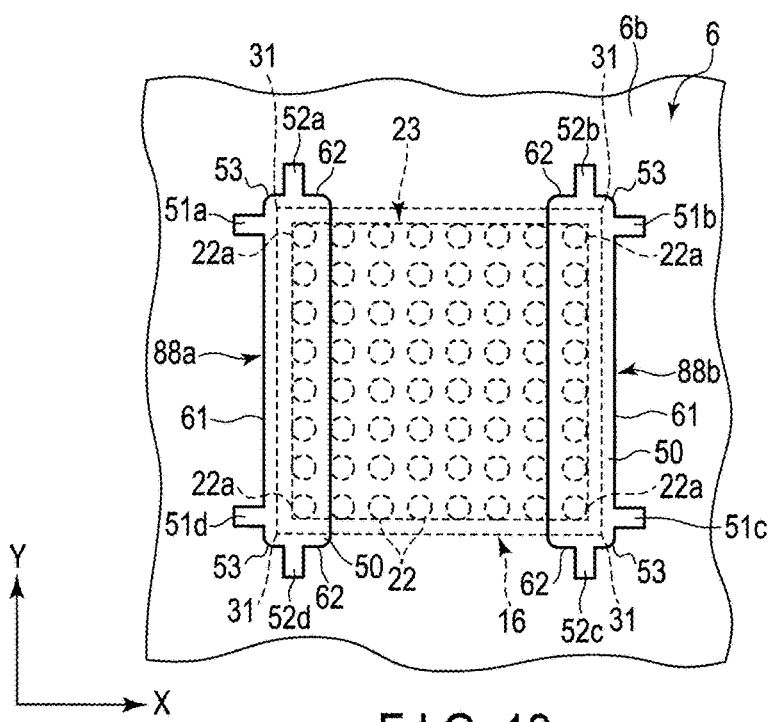
FIG. 12 is a plan view of a fourth modification of the support plate.

A fourth modification shown in FIG. 12 is similar to the embodiment shown in FIGS. 3 and 4 except that a number of support plates 88 according to the fourth modification is two. A first support plate 88a is arranged in place of the two support plates 41a and 41d shown in FIGS. 3 and 4. A second support plate 88b is arranged in place of the two support plates 41b and 41c shown in FIGS. 3 and 4. The first support plate 88a is arranged to cover the leftmost column of bumps 22. The second support plate 88b is arranged to cover the rightmost column of bumps 22. The support plates 88a and 88b may be arranged to cover all the uppermost and/or lowest rows of bumps 22. The first outer side 61 of the main portion 50 of the support plate 88 extends along the Y direction. The two second outer sides 62 of the main portion 50 extend along the X direction from both end portions of the first side 61. The two first projecting portions 51a and 51d are in contact with the main portion 50 at the first outer side 61 and protrude from the first side 61. The two second projecting portions 52a and 52d are in contact with the main portion 50 at two second outer sides 62 and protrude from the two second outer sides 62. The corners of the main portion 50 may be rounded.

Figure 13:
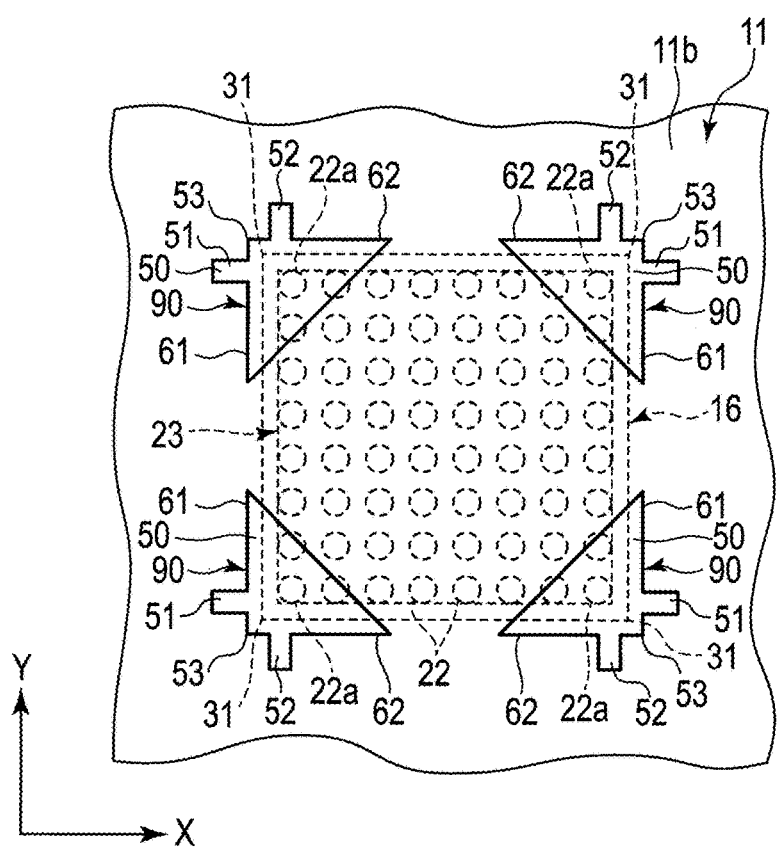
FIG. 13 is a plan view of a fifth modification of the support plate.

A fifth modification shown in FIG. 13 is similar to the embodiment shown in FIGS. 3 and 4 except that the shape of a main portion 50 of a support plate 90 according to the fifth modification is triangular. Corners of the triangular main portion 50 of the support plate 90 may be rounded. The first outer side 61 of the main portion 50 extends along the Y direction. The second outer side 62 of the main portion 50 extends along the X direction. The first outer side 61 and the second outer side 62 are outside the planar area of the semiconductor package 16. The first outer side 61 and the second outer side 62 are commonly connected to one of corners, the corner 53 of the main portion 50. The corner 53 is arranged near the corner 31 of the semiconductor package 16. The first projecting portion 51 is in contact with the main portion 50 at the first outer side 61 and protrudes from the first outer side 61 in the same plane as the main portion 50. The second projecting portion 52 is in contact with the main portion 50 at the second outer side 62 and protrudes from the second outer side 62 in the same plane as the main portion 50. The shape of the first projecting portion 51 and/or the second projecting portion 52 may be triangular, rectangular, square, or a combination of a triangular and rectangular. Corners of the projecting portions 51 and 52 may be rounded. The first projecting portion 51 and the second projecting portion 52 are configured to receive an impact wave before the corner 53 receives the impact wave if the impact wave is transmitted from the oblique direction, thereby preventing the impact wave from being concentrated onto the corner bump 22a.

According to the modifications shown in FIGS. 9 to 12, the support plate 84, 86, 88, or 90 is arranged not only to cover the corner bump 22a, but also to cover the corner 31 of the semiconductor package 16 as a back plate. Therefore, the mechanical reliability of the semiconductor package 16 can be enhanced.

Moreover, according to the modifications shown in FIGS. 8 and 10, it is possible to arrange an additional component other than components shown in FIG. 3 or FIG. 4 at the corner portion of the semiconductor package 16 and to avoid interference with the housing and the additional components.

According to the modification shown in FIG. 12, the flexural rigidity thereof as a whole is enhanced and therefore a further advantageous effect can be expected against the static stress. Further, the number of the support plates is decreased to a half, thereby achieving even a further advantage of lower production cost.

As described above, the shape of the support plate applicable to the embodiment is not limited to the L-shape, but other shapes may be selected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
a housing;
a circuit board in the housing, the circuit board comprising a first surface and a second surface, the second surface opposite to the first surface;
a semiconductor package comprising four first corners and electrodes in a first area comprising four second corners, the semiconductor package mounted on the first surface of the circuit board via parts of the electrodes at the four second corners; and
four support plates on the second surface of the circuit board, the support plates at positions corresponding to the four second corners, wherein
each of the four support plates comprises a main portion, a first projecting portion protruded from a first side of the main portion, and a second projecting portion protruded from a second side of the main portion,
the main portion, the first projecting portion, and the second projecting portion of each of the four support plates are arranged in a plane,
the main portion of each of the four support plates comprises a third corner at an intersection of the first side and the second side,
the third corner is between one of the four first corners and a corresponding one of the four second corners, and
the first projecting portion and the second projecting portion of each of the four support plates are arranged such that an imaginary line in the plane and connecting a corner of the first projecting portion and a corner of the second projecting portion is outside the main portion.

2. The electronic device of claim 1, wherein
the first projecting portion and the second projecting portion are formed to be integrated with the main body.

3. The electronic device of claim 2, wherein
the main portion of each of the four support plates comprises an L-shaped portion, a triangular portion, a square portion, or a rectangular portion at positions corresponding to corners of the semiconductor package.

4. The electronic device of claim 2, wherein
the electrodes comprise an array of bumps, and
each of the four support plates is arranged to cover several bumps in the array of bumps, the several bumps including bumps at the four second corners of the first area.

5. The electronic device of claim 4, wherein
when an impact wave is transmitted to the circuit board, the first projecting portion and the second projecting portion receive the impact wave before the main portion receives the impact wave, and a stress from the impact wave is dispersed to the bumps at the four second corners of the first area.

6. A circuit board module comprising:
a circuit board comprising a first surface and a second surface, the second surface opposite to the first surface;
a semiconductor package comprising four first corners and electrodes in a first area comprising four second corners, the semiconductor package mounted on the first surface of the circuit board via parts of the electrodes at the four second corners; and
four support plates on the second surface of the circuit board, the support plates at positions corresponding to the four second corners, wherein
each of the four support plates comprises a main portion, a first projecting portion protruded from a first side of the main portion, and a second projecting portion protruded from a second side of the main portion,
the main portion, the first projecting portion, and the second projecting portion of each of the four support plates are arranged in a plane,
the main portion of each of the four support plates comprises a third corner at an intersection of the first side and the second side,
the third corner is between one of the four first corners and a corresponding one of the four second corners, and
the first projecting portion and the second projecting portion of each of the four support plates are arranged such that an imaginary line in the plane and connecting a corner of the first projecting portion and a corner of the second projecting portion is outside the main portion.

7. The circuit board module of claim 6, wherein
the first projecting portion and the second projecting portion are formed to be integrated with the main body.

8. The circuit board module of claim 7, wherein
the main portion of each of the four support plates comprises an L-shaped portion, a triangular portion, a square portion, or a rectangular portion at positions corresponding to corners of the semiconductor package.

9. The circuit board module of claim 7, wherein
the electrodes comprise an array of bumps, and
each of the four support plates is arranged to cover several bumps in the array of bumps, the several bumps including bumps at the four second corners of the first area.

10. The circuit board module of claim 9, wherein
when an impact wave is transmitted to the circuit board, the first projecting portion and the second projecting portion receive the impact wave before the main portion receives the impact wave, and a stress from the impact wave is dispersed to the bumps at the four second corners of the first area.

\* \* \* \* \*